United States Patent [19]
Blalock

[11] Patent Number: 6,062,133
[45] Date of Patent: *May 16, 2000

[54] GLOBAL PLANARIZATION METHOD AND APPARATUS

[75] Inventor: Guy Blalock, Boise, Id.

[73] Assignee: Micron Technology, Inc., Boise, Id.

[*] Notice: This patent is subject to a terminal disclaimer.

[21] Appl. No.: 09/287,502

[22] Filed: Apr. 7, 1999

Related U.S. Application Data

[60] Continuation of application No. 08/761,630, Dec. 6, 1996, Pat. No. 5,967,030, which is a division of application No. 08/560,552, Nov. 17, 1995, abandoned.

[51] Int. Cl.[7] ....................................................... B30B 5/02
[52] U.S. Cl. .................. 100/211; 100/269.02; 156/583.3
[58] Field of Search .............................. 100/211, 269.02, 100/269.03, 269.04; 156/382, 583.3

[56] References Cited

U.S. PATENT DOCUMENTS

| | | |
|---|---|---|
| 1,777,310 | 10/1930 | Hopkinson . |
| 2,373,770 | 4/1945 | Martin . |
| 2,431,943 | 12/1947 | Land et al. . |
| 3,120,205 | 2/1964 | Pfeiffer et al. . |
| 3,135,998 | 6/1964 | Fowler et al. . |
| 3,850,559 | 11/1974 | Mintz et al. . |
| 4,234,373 | 11/1980 | Reavill et al. . |
| 4,476,780 | 10/1984 | Bunch . |
| 4,700,474 | 10/1987 | Choinski . |
| 4,734,155 | 3/1988 | Tsunoda et al. . |
| 4,806,195 | 2/1989 | Namysi . |
| 4,810,672 | 3/1989 | Schwarzbauer . |
| 5,049,232 | 9/1991 | Tola . |
| 5,078,820 | 1/1992 | Hamamuna et al. . |
| 5,122,848 | 6/1992 | Lee et al. . |
| 5,232,875 | 8/1993 | Tuttle et al. . |

(List continued on next page.)

FOREIGN PATENT DOCUMENTS

| | | |
|---|---|---|
| 0 683 511 A2 | 11/1995 | European Pat. Off. . |
| 0 683 511 A3 | 11/1995 | European Pat. Off. . |
| 998210 | 7/1965 | United Kingdom . |
| 90/12683 | 11/1990 | WIPO . |

OTHER PUBLICATIONS

Cameron et al., "Photogeneration of Organic Bases from o-Nitrobenzyl-Derived Carbamates," J. Am. Chem. Soc., 1991, 113, pp. 4303-4313.

Cameron et al., "Base Catalysis in Imaging Materials," J. Org. Chem., 1990, 55, pp. 5919-5922.

(List continued on next page.)

*Primary Examiner*—Daniel B. Moon
*Attorney, Agent, or Firm*—Trask, Britt & Rossa

[57] ABSTRACT

An apparatus for performing a global planarization of a surface of a deformable layer of a wafer on a production scale. The apparatus includes a chamber having a pressing surface and containing a rigid plate and a flexible pressing member or "puck" disposed between the rigid plate and the pressing surface. A wafer having a deformable outermost layer is placed on the flexible pressing member so the deformable layer of the wafer is directly opposite and substantially parallel to the pressing surface. Force is applied to the rigid plate which propagates through the flexible pressing member to press the deformable layer of the wafer against the pressing surface. Preferably, a bellows arrangement is used to ensure a uniformly applied force to the rigid plate. The flexible puck serves to provide a self adjusting mode of uniformly distributing the applied force to the wafer, ensuring the formation of a high quality planar surface. The surface of the wafer assumes the shape of the pressing surface and is hardened in a suitable manner while under pressure to produce a globally planarized surface on the wafer. After the force is removed from the rigid plate, lift pins are slidably inserted through the rigid plate and the flexible pressing member to lift the wafer off of the surface of the flexible pressing member.

54 Claims, 2 Drawing Sheets

U.S. PATENT DOCUMENTS

| | | |
|---|---|---|
| 5,238,862 | 8/1993 | Blalock et al. . |
| 5,250,450 | 10/1993 | Lee et al. . |
| 5,261,997 | 11/1993 | Inselmann . |
| 5,286,329 | 2/1994 | Iijima et al. . |
| 5,300,155 | 4/1994 | Sandhu et al. . |
| 5,300,801 | 4/1994 | Blalock et al. . |
| 5,302,233 | 4/1994 | Kim et al. . |
| 5,302,343 | 4/1994 | Jacob . |
| 5,314,843 | 5/1994 | Yu et al. . |
| 5,434,107 | 7/1995 | Paranjpe . |
| 5,533,924 | 7/1996 | Stroupe et al. . |
| 5,554,065 | 9/1996 | Clover . |
| 5,558,015 | 9/1996 | Miyashita et al. . |
| 5,569,062 | 10/1996 | Karlsrud . |
| 5,575,707 | 11/1996 | Talieh et al. . |
| 5,618,381 | 4/1997 | Doan et al. . |
| 5,624,299 | 4/1997 | Shendon . |
| 5,624,300 | 4/1997 | Kishii et al. . |
| 5,624,303 | 4/1997 | Robinson . |
| 5,624,304 | 4/1997 | Pasch et al. . |
| 5,639,697 | 6/1997 | Weling et al. . |
| 5,643,046 | 7/1997 | Katakabe et al. . |
| 5,643,050 | 7/1997 | Chen . |
| 5,643,406 | 7/1997 | Shimomura et al. . |
| 5,643,837 | 7/1997 | Hayashi . |
| 5,679,610 | 10/1997 | Matsuda et al. . |
| 5,736,424 | 4/1998 | Pryoyla et al. . |

OTHER PUBLICATIONS

Allen et al., "Photoresists for 193–nm Lithography," IBM J. Res. Develop., vol. 41, No. 1/2, Jan.–Mar. 1997, pp. 95–104.

Seeger et al., "Thin–Film Imaging: Past, Present, Prognosis," IBM J. Res. Develop., vol. 41, No. 1/2, Jan.–Mar. 1997, pp. 105–118.

Shaw et al., "Negative Photoresists for Optical Lithography," IBM J. Res. Develop., vol. 41, No. 1/2, Jan.–Mar. 1997, pp. 81–94.

Ito, H., "Chemical Amplification Resists: History and Development Within IBM," IBM J. Res. Develop., vol. 41, No. 1/2, Jan.–Mar. 1997, pp. 69–80.

Rothschild et al., "Lithography at a Wavelength of 193 nm," IBM J. Res. Develop., vol. 41, No. 1/2, Jan.–Mar. 1997, pp. 49–55.

GLOBAL PLANARIZATION METHOD AND APPARATUS

CROSS REFERENCE TO RELATED APPLICATION

This application is a continuation of application Ser. No. 08/761,630, filed Dec. 6, 1996, U.S. Pat. N.o. 5,967,030 which is a divisional of application Ser. No. 08/560,552, filed Nov. 17, 1995, abandoned.

BACKGROUND OF THE INVENTION

1. Field of the Invention

The present invention relates to creating planar surfaces on a substrate. More particularly, the present invention relates to global planarization methods and apparatuses designed to produce a microscopically smooth surface on a semiconductor wafer.

2. Background of Related Art

Integrated circuits are typically constructed by depositing layers of predetermined materials to form the circuit components on a wafer shaped semiconductor substrate. The formation of the circuit components in each layer produces a rough, or planar topography on the surface of the wafer. The resulting nonplanar surface must be made smooth and planar to provide a proper surface for the formation of subsequent layers of the integrated circuitry. Planarization of the outermost surface of the wafer is performed locally over small regions of the wafers and globally over the entire surface. Typically, a layer of oxide is deposited over the exposed circuit layer to provide an insulating layer for the circuit and to locally planarize regions. A thicker layer is then deposited on top of the insulating layer to provide a surface that can be globally planarized without damaging the deposited circuitry. The thick outer layer is generally composed of an oxide or a polymer material. Spin coating is a commonly used technique to form the thick polymer layers on a wafer. Thick oxide layers can be deposited using conventional deposition techniques. While those techniques are useful in producing uniform thickness layers, neither technique is particularly effective at producing a planar surface when applied to a nonplanar surface. As such, additional surface preparation is generally required prior to forming additional circuit layers on the wafer.

Conventional methods for globally planarizing the outermost surface of the wafer include chemical etching and chemical mechanical polishing (CMP) of the surface. In chemical etching, a thick layer is produced over the circuit layer as described above and the thick layer is chemically etched back to planarize the surface. Global planarization by this technique is iterative in that following the etching step, if the surface was not sufficiently smooth, a new layer of polymer or oxide must be formed and subsequently etched back. This process is time consuming, lacks predictability due to the iterative procedure for obtaining a planarized surface and consumes significant amounts of oxides and/or polymers in the process.

In the CMP technique, a reactive chemical slurry is used in conjunction with a polishing pad to planarize the surface of the wafer. Two problems associated with the CMP techniques are that the chemicals may become unevenly distributed in the pad, and particulates removed from the substrate during the polishing process may become lodged in the pad, both of which result in nonuniformity in the substrate surface. As a result, CMP techniques are generally less desirable since the process is often time consuming, exposes the wafers to aggressive chemicals and may not yield the desired results in terms of final surface quality.

An alternative to the above techniques is the use of a press planarization technique to globally planarize the surface of the wafer. In global press planarization, a deformable layer is deposited on the surface of the wafer containing the circuit components by conventional processes known in the art, such as by spin coating. The surface of the deformable layer, which is usually an uncured polymer, is pressed against a surface having surface characteristics which are desired for the surface of the wafer. The deformable layer is typically then cured while under pressure to harden the deformable layer to produce a planarized outermost surface of the desired surface quality.

Apparatuses used to perform the global press planarization are known in the art, such as those disclosed in U.S. Pat. No. 5,434,107 to Paranjpe. A problem with those global planarization apparatuses is encountered due to the need to apply a uniform force to the deformable layers while providing an apparatus to be used in production scale operations. For instance, the pressing surfaces of such apparatuses contain holes to allow loading fingers to pass through the surface and lift the wafer; these holes will invariably lead to nonuniform pressure distributions across the surface of the wafer and in the surface of the deformable layer. Additionally, the force used to planarize is applied directly to the surface of the wafer; therefore, any nonuniformities in the application of the force will be directly propagated to the surface layer resulting in less than optimal surface characteristics. The Paranjpe patent suggests a possible solution to the potential direct application of a nonuniform force through the use of direct fluid contact with the wafer and the application of the planarizing force to the wafer by pressurizing the fluid. However, the use of pressurized fluid contact results in substantial complications involved with handling pressurized fluid, as well as exposing the wafer to the fluid and the necessary addition of drying steps to the process. The aforementioned difficulties result in increased throughput time, require precise production controls and a higher potential for damage to the wafers during processing.

It is therefore an object of the present invention to provide a method and an apparatus for global process planarization of the surface layer of a semiconductor wafer that is conducive to automated handling and provides for a uniform distribution of force to planarize the surface.

SUMMARY OF THE INVENTION

The above objects and others are accomplished by a global planarization method and apparatus in accordance with the present invention. The apparatus includes a chamber having a pressing surface and containing a rigid plate and a flexible pressing member or "puck" disposed between the rigid plate and the pressing surface. A semiconductor wafer having a deformable outermost layer is placed on the flexible pressing member so the surface of the deformable layer of the wafer is directly opposite and parallel to the pressing surface. Force is applied to the rigid plate which propagates through the flexible pressing member to press the surface of the wafer against the pressing surface. Preferably, a bellows arrangement is used to further ensure a uniformly applied force to the rigid plate. The flexible puck serves to provide a self adjusting mode of uniformly distributing the applied force to the wafer ensuring the formation of a high quality planar surface. The surface of the wafer assumes the shape of the pressing surface and is cured in a suitable manner while under pressure so that the surface of the wafer maintains the shape of the pressing surface after processing to produce a globally planarized surface on the wafer. After the force is removed from the rigid plate, lift pins are slidably inserted through the rigid plate and the flexible pressing member to lift the wafer off the surface of the flexible pressing member.

Accordingly, the present invention provides an effective solution to problems associated with planarizing the surfaces of semiconductor wafers on a production scale. These advantages and others will become apparent from the following detailed description of the present invention.

BRIEF DESCRIPTION OF THE DRAWINGS

The preferred embodiment of the present invention will be described in greater detail with reference to the accompanying drawings, wherein like members bear like reference numerals and wherein.

DETAILED DESCRIPTION OF THE INVENTION

Figure 1:
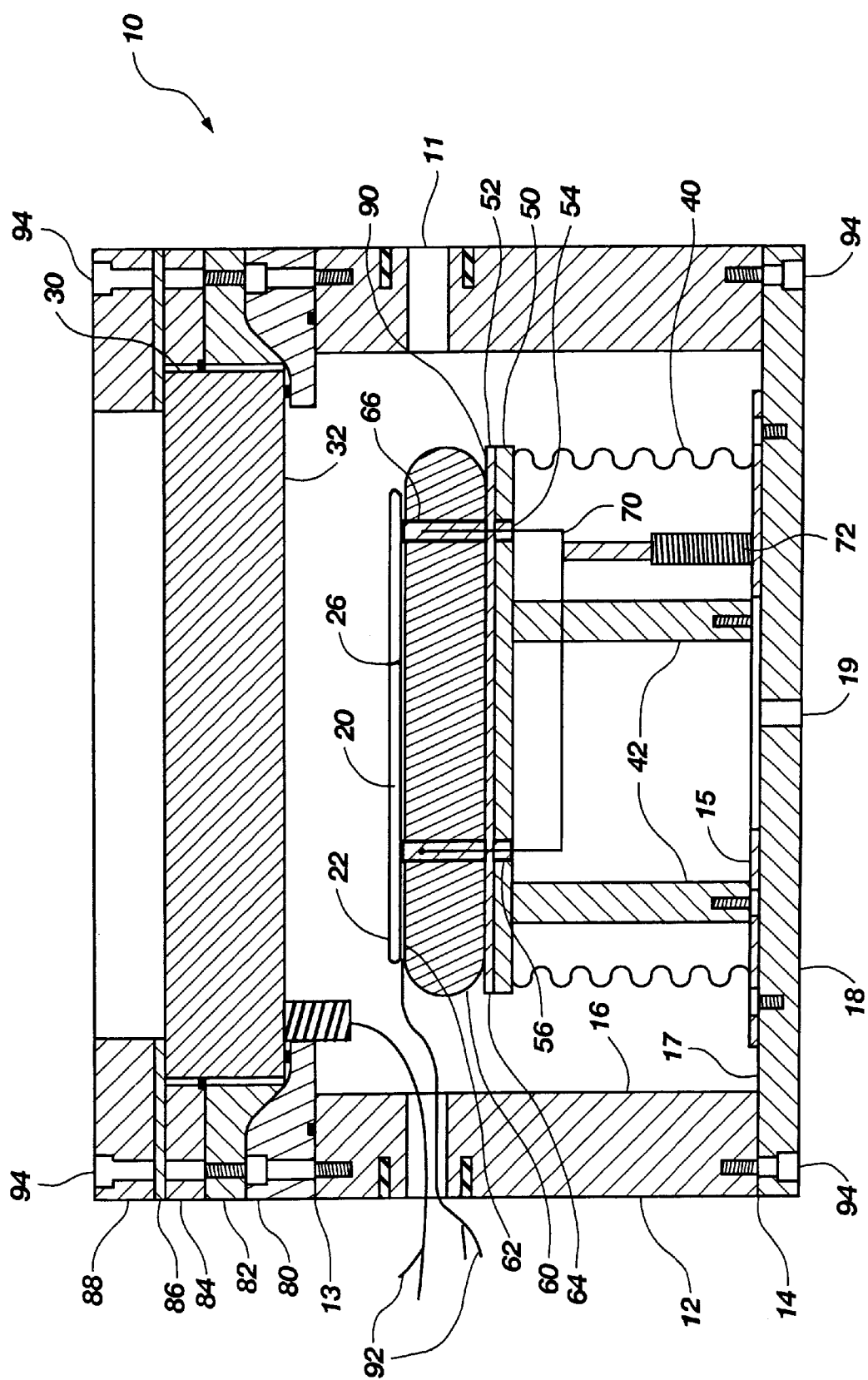
FIG. 1 is a side view of a preferred embodiment of the present invention in a first position.
Figure 2:
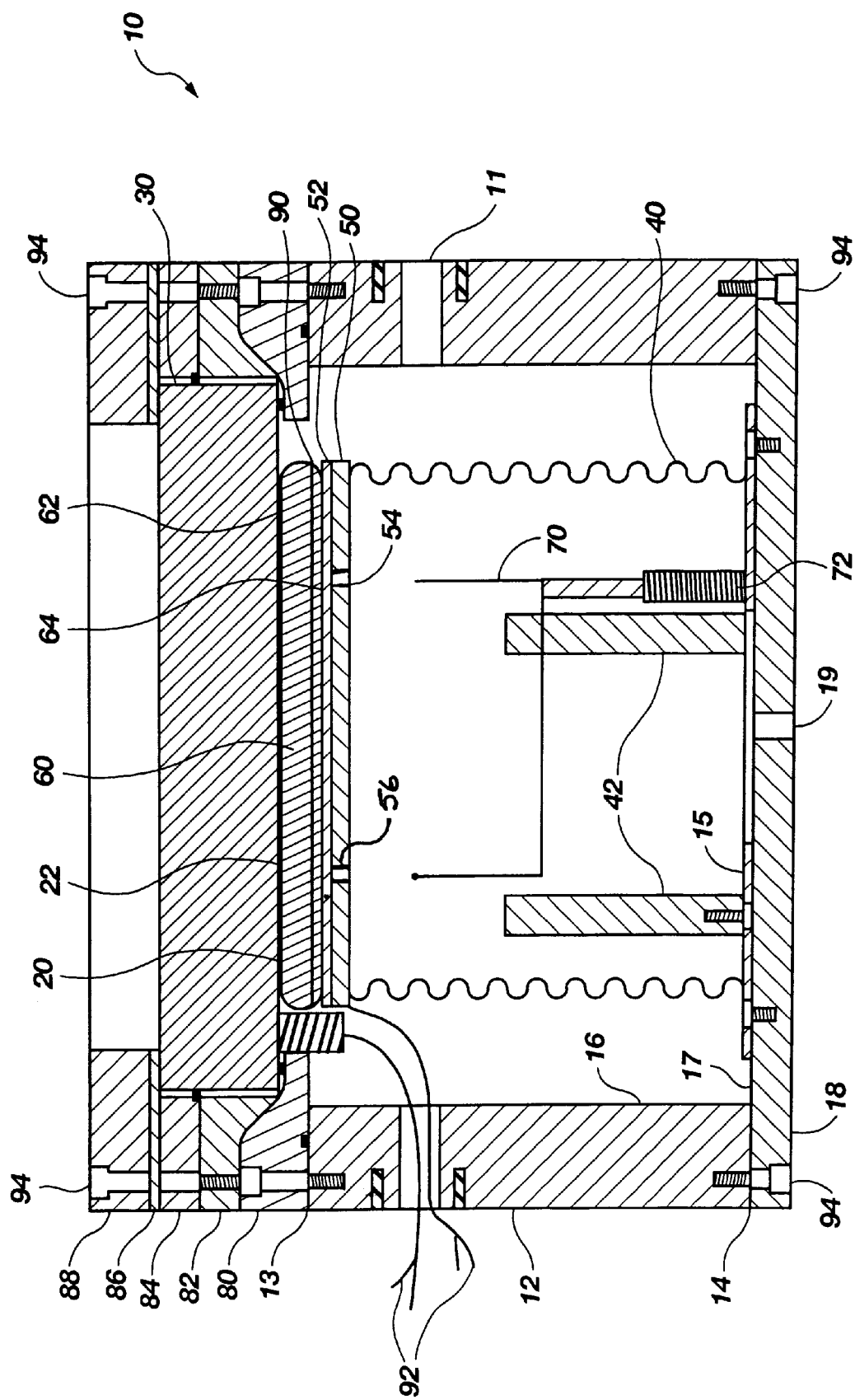
FIG. 2 is a side view of a preferred embodiment of the present invention in a second position.

The operation of the global planarization apparatus 10 will be described generally with reference to the drawings for the purpose of illustrating presently preferred embodiments of the invention only and not for purposes of limiting the same. The global planarization apparatus 10 of the present invention serves to press the surface of a semiconductor wafer 20 having multiple layers including a deformable outermost layer 22 against a fixed pressing surface 32. The surface of deformable layer 22 will assume the shape and surface characteristics of the pressing surface 32 under the application of a force to the wafer 20. The deformable layer 22 can then be cured in a suitable manner while pressed against the pressing surface 32 so that the surface of the wafer maintains the surface characteristics corresponding to the pressing surface 32. FIGS. 1 and 2 show one embodiment of the global planarization apparatus 10 in the rest and pressing modes, respectively. While preferred embodiments of the invention will be discussed with respect to producing a globally planarized highly smooth surface, one skilled in the art will appreciate that the invention can be suitably modified to produce a curved or a textured surface on the wafer 20.

In a preferred embodiment, the global planarization apparatus 10 includes a fully enclosed apparatus having a hollow cylindrical chamber body 12 formed from a rigid material, such as aluminum, other metals or hard composites, and having open top and bottom ends, 13 and 14, respectively, an interior surface 16 and an evacuation port 11. A base plate 18 having an inner surface 17 is attached to the bottom end 14 of chamber body 12, by conventional means, such as bolts 94 shown in FIGS. 1 and 2. A press plate 30 is removably mounted to the top end 13 of chamber body 12 with pressing surface 32 facing base plate 18. The interior surface 16 of chamber body 12, the pressing surface 32 of press plate 30 and the inner surface 17 of base plate 18 define a sealable chamber. It will be appreciated that evacuation port 11 can be positioned through any surface defining the sealed chamber but not used to engage wafer 20, such as through base plate 18, and not solely through chamber body 12.

The press plate 30 has a pressing surface 32 with dimensions greater than that of the wafers 20 and is of a sufficient thickness to withstand applied pressures. Press plate 30 is formed from non-adhering material capable of being highly polished, preferably with surface variations less than 500 Angstroms, so that pressing surface 32 will impart the desired smooth and flat surface quality to the surface of the deformable layer 22 on wafer 20. In a preferred embodiment, the press plate 30 is a disc shaped quartz optical flat. However, material selection for the press plate 30 can be specifically tailored to meet process requirements by considering factors such as the range of applied pressures and the method of hardening the deformable layer, such as heat or radiation (UV, IR, etc.), as well as whether the surface 22 of the wafer 20 will be planar, curved or textured.

A rigid plate 50 having top and bottom surfaces 52 and 54, respectively, and lift pin penetrations 56 therethrough is disposed within chamber body 12 with the top surface 52 substantially parallel to and facing the pressing surface 32. In the case where the surface of wafer 20 is to be curved, the term parallel is understood to mean that the all points of the top surface 52 of rigid plate 50 are equidistant from the corresponding points on pressing surface 32. The rigid plate 50 is constructed from a material of sufficient rigidity, such as aluminum, to transfer a load under an applied force with minimal deformation.

In a preferred embodiment, a uniform force is applied to the bottom surface 54 of rigid plate 50 through the use of a bellows arrangement 40 and relatively pressurized gas to drive rigid plate 50 toward pressing surface 32. Such relative pressure can be achieved by supplying gas under pressure or, if the chamber body 12 is under vacuum, allowing atmospheric pressure gas into bellows 40. The bellows 40 is attached at one end to the bottom surface 54 of rigid plate 50 and to the inner surface 17 of base plate 18 with a bolted mounting plate 15 to form a pressure containment that is relatively pressurized through port 19 in base plate 18. As shown in FIG. 2, when the bellows 40 is relatively pressurized, a force will be applied on the bottom surface 54 driving the rigid plate 50 toward the pressing surface 32. As shown in FIG. 1, one or more stand off brackets 42 are mounted to the inner surface 17 of the base plate 18 to limit the motion toward base plate 18 of the rigid plate 50, when the bellows 40 is not relatively pressurized. The application of force through the use of a relatively pressurized gas ensures the uniform application of force to the bottom surface 54 of rigid plate 50. The use of rigid plate 50 will serve to propagate the uniform pressure field with minimal distortion. Alternatively, the bellows 40 can be replaced with any other suitable means for consistently delivering a uniform force such as hydraulic and pneumatic linear drives or mechanical or electrical linear displacement mechanisms.

In a preferred embodiment, a flexible pressing member or "puck" 60 is provided having upper and lower surfaces 62 and 64, respectively, which are substantially parallel to the top surface 52 of rigid plate 50 and pressing surface 32. Lift pin penetrations 66 are provided through the puck 60. The flexible puck 60 is positioned with its lower surface 64 in contact with the top surface 52 of rigid plate 50 and lift pin penetrations 66 aligned with lift pin penetrations 56 in rigid plate 50. The upper surface 62 of the flexible puck 60 is directly opposite and substantially parallel to the pressing surface 32 of press plate 30. The flexible puck 60 is formed from a material, such as 30 durometer silicone or other materials of similar low viscosity, that will deform under an applied force to close lift pin penetrations 66 and uniformly distribute the applied force to the wafer, even when the top surface 52, the upper surface 62 and/or the lower surface 64 is not completely parallel to the pressing surface 32 or when thickness variations exist in the wafer 20, rigid plate 50 or puck 60, as well as other sources that result in nonuniformities in the applied force. It is also preferred that puck 60 is formed from a material that is thermally resistant in the temperature ranges of interest.

In a preferred embodiment, lift pins 70 are slidably disposable through lift pin penetrations, 56 and 66, respectively, in the form of apertures, to contact the bottom surface 26 of wafer 20 for lifting the wafer 20 off of the top surface 62 of flexible puck 60. Movement of the lift pins 70 is controlled by a lift pin drive assembly 72, which is mounted on the inner surface 17 of the base plate 18. The lift pin drive assembly 72 can provide for either manual or automatic control of the lift pins 70 through the use of pneumatic, hydraulic or other conventional drive means as is known in the art. Lift pins 70 and lift pin drive assembly 72 are preferably positioned outside of the pressure boundary defined by the bellows 40 to minimize the number of pressure boundary penetrations. However, the lift pin 70 and lift pin drive assembly 72 can alternatively be located within the pressure boundary when used in conjunction with vacuum seals in the lift pin penetrations 56, as is known in the art to maintain the pressure boundary.

In a preferred embodiment, a multi-piece assembly consisting of lower lid 80, middle lid 82, top lid 84, gasket 86 and top clamp ring 88 is used to secure the press plate 30 to the top end 13 of chamber body 12. The ring-shaped lower lid 80 is mounted to the top end 13 of chamber body 12 and has a portion with an inner ring dimension smaller than press plate 30, so that press plate 30 can be seated on lower lid 80 as shown in FIGS. 1 and 2. Middle lid 82 and top lid 84 are ring-shaped members of an inner ring dimension greater than press plate 30 and are disposed around press plate 30. Middle lid 82 is affixed between lower lid 80 and top lid 84. A gasket 86 and top clamp ring 88 are ring-shaped members with an inner ring dimension less than press plate 30 and are seated on the surface of press plate 30 external to the chamber. Conventional means, such as bolts 94 shown in FIGS. 1 and 2, are used to secure the press plate 30 to the chamber body 12. While a multi-piece assembly is used to secure press plate 30, one skilled in the art will appreciate that other suitable attachment designs are possible, including providing access to the interior chamber through any surface defining the chamber not used to engage wafer 20.

In a preferred embodiment, heating elements 90 and thermocouples 92 are provided to control the temperature of the flexible puck 60. However, it can be appreciated that additional heating elements 90 and thermocouples 92 can be added to the press plate 30 and/or to rigid plate 50. In a preferred embodiment, any conventional means, such as a vacuum pump, for evacuating the chamber body 12 prior to pressing the wafer 20 against the pressing surface 32 can be used with the present invention.

In the operation of the present invention, the top clamp ring 88, gasket 86, upper lid 84 and middle lid 82 are removed from the chamber body 12 and the press plate 30 is lifted from lower lid 80. At this stage, the bellows 40 is deflated and rigid plate 50 is seated on stand off brackets 42. The wafer 20 is then placed on the flexible puck 60 with the side of the wafer 20 opposite the deformable layer 22 in contact with flexible puck 60. Thereafter, the press plate 30 is returned to its position on the lower lid 80, and the middle lid 82 and upper lid 84 are reinstalled and tightened down using gasket 86 and top clamp ring 88 thereby sealing press plate 30 between top clamp ring 88 and lower lid 80. If desirable, the temperatures of flexible puck 60, press plate 30 and rigid plate 50 can be adjusted through the use of heating elements 90 and monitored by thermocouples 92 to vary the deformation characteristics of the outermost layer 22 of wafer 20. Preferably, chamber body 12 is then evacuated through port 19 to a pressure of approximately 50 millitorr.

A pressure differential is established between the interior and exterior of the bellows 40, either by pressurizing or by venting when the chamber body 12 has been evacuated, to drive rigid plate 50, puck 60 and wafer 20 toward press plate 30 and bring deformable layer 22 of wafer 20 into engagement with pressing surface 32 of press plate 30. Upon engagement of the wafer 20 with the press plate 30, the continued application of force will deform the flexible pressing member 60 which serves to close lift pin penetrations 66 and to distribute the force to ensure the wafer 20 experiences a uniform pressure on its deformable layer 22. After the wafer 20 has been in engagement with pressing surface 32 for a sufficient time to cause its deformable layer 22 to correspond to the pressing surface 32, the deformable layer 22 may be cured, if necessary, in any conventional manner, such as radiation or heat, so that the deformable layer 22 of the wafer 20 maintains the shape and surface characteristics corresponding to the pressing surface 32. The air pressure is then released from the bellows 40 thereby retracting wafer 20, puck 60 and rigid plate 50 from the press plate 30. The downward movement of rigid plate 50 will be terminated by its engagement with stand off offset brackets 42.

Once the rigid plate 50 is fully retracted, the vacuum is released in chamber body 12. Lift pins 70 are moved through lift pin penetrations 56 in the rigid plate 50 and lift pin penetrations 66 in the flexible puck 60 to lift wafer 20 off of the flexible puck 60. The top clamp ring 88, gasket 86, top lid 84, middle lid 82 and press plate 30 are removed and the wafer 20 is removed off of lift pins 70 for further processing.

A specific example is provided to further illustrate the method and operation of the apparatus. A wafer 20 having a nominal 1–5 micron thick deformable layer 22 consisting of a UV curable epoxy resin is placed on the flexible puck 60 within chamber body 12. Chamber body 12 is evacuated to a pressure of approximately 50 millitorr. A pressure differential is established across the bellows 40 by venting the bellows 40 to atmosphere to drive wafer 20 against press plate 30. A pressure of 100 psi is then applied to the wafer 20 for 1 minute at a temperature of approximately 50° C. to shape the surface of the epoxy resin to correspond to that of the pressing surface 32. The deformable layer 22 is then cured while in contact with press plate 30 by the application of ultraviolet radiation for approximately 15–30 seconds through a quartz optical flat used as press plate 30.

Those of ordinary skill in the art will appreciate that the present invention provides great advantages over other options for planarizing deformable surface layers. In particular, the subject invention is designed such that the pressure boundary does not have to be breached to operate the apparatus as is true with prior art designs. The subject invention also eliminates the need to use a pressure boundary as the supporting surface for the wafers. Also, the subject invention has the advantage of providing for the automated handling of the wafers, which was not present in the prior art. Thus, the present invention provides a significant reduction in the overall cost associated with the production of semiconductor wafers. While the subject invention provides these and other advantages over other planarization apparatuses, it will be understood, however, that various changes in the details, materials and arrangements of parts which have been herein described and illustrated in order to explain the nature of the invention may be made by those skilled in the art within the principle and scope of the invention as expressed in the appended claims.

What is claimed is:

1. An apparatus for performing global planarization of a deformable surface of a wafer comprising:
   a chamber body having an interior surface and first and second ends;
   a base plate attached to and closing said first end of said chamber body, said base plate having an inner surface;
   a press plate attached to and closing said second end of said chamber body, said press plate having a pressing surface, said pressing surface, said inner surface and said interior surface defining a chamber;
   a rigid plate having a top surface and a bottom surface disposed within said chamber, said top surface being substantially parallel to said pressing surface, said rigid plate distributing an applied force to said wafer;
   a flexible pressing puck member having upper and lower surfaces, said lower surface of said flexible pressing puck member being seated on said top surface of said rigid plate, said upper surface of said flexible pressing puck member being directly opposite to said pressing surface, said flexible pressing puck member distributing an applied force thereto by said rigid plate to said wafer; and
   a drive for uniformly applying force to said bottom surface of said rigid plate to drive said rigid plate and said flexible pressing puck member toward said pressing surface.

2. The apparatus of claim 1, further comprising a stand off bracket attached to said inner surface of said base plate between said rigid plate and said base plate for restricting movement of said rigid plate toward said base plate.

3. The apparatus of claim 1, wherein said press plate comprises a highly polished pressing surface.

4. The apparatus of claim 1, wherein said drive comprises a pneumatic lift attached between said bottom surface of said rigid plate and said inner surface of said base plate, and means for supplying pneumatic fluid under pressure to said pneumatic lift.

5. The apparatus of claim 1, further comprising a lift for lifting said wafer off said upper surface of said flexible pressing puck member.

6. The apparatus of claim 1, wherein said flexible pressing puck member is formed from a material selected from the group consisting of silicone, silicone-based rubbers and combinations thereof.

7. An apparatus for globally planarizing a surface of an object, comprising:
   a press plate having a pressing surface;
   a rigid plate having a top surface opposing said pressing surface; and
   a pressing puck member positioned on said top surface opposing said pressing surface to distribute a force applied to said pressing puck member using said press plate and said rigid plate.

8. The apparatus of claim 7, wherein the applied force is applied to said rigid plate to press said pressing puck member against said press plate.

9. The apparatus of claim 7, wherein said pressing puck member is deformable under the applied force.

10. The apparatus of claim 9, wherein said pressing puck member is comprised of silicone rubber.

11. The apparatus of claim 9, wherein said pressing puck member deforms under the applied force to apply the force.

12. The apparatus of claim 7, wherein:
   said rigid plate is substantially parallel to said pressing surface; and
   said pressing puck member has substantially parallel upper and lower surfaces, said lower surface of said pressing puck member being seated on said top surface of said rigid plate, said upper surface of said pressing puck member being directly opposite and substantially parallel to said pressing surface.

13. The apparatus of claim 7, further comprising:
   a chamber body having an interior surface and first and second ends;
   a base plate attached to and closing said first end of said chamber body, said base plate having an inner surface; and
   a drive for applying a force to be applied by said pressing puck member, and, wherein,
   said press plate is attached to said second end of said chamber body, said pressing surface, said inner surface and said interior surface defining a closed chamber, and said rigid plate and said pressing puck member are disposed within said chamber.

14. The apparatus of claim 13, wherein said drive is attached to said rigid plate opposite to said top surface to press said pressing puck member against said pressing surface.

15. An apparatus for performing global planarization of a deformable surface of a wafer comprising:
   a chamber body having an interior surface and first and second ends;
   a base plate attached to and closing said first end of said chamber body, said base plate having an inner surface;
   a press plate attached to and closing said second end of said chamber body, said press plate having a pressing surface, said pressing surface, said inner surface and said interior surface defining a chamber;
   a rigid plate having a top surface and a bottom surface disposed within said chamber, said top surface being substantially parallel to said pressing surface;
   a pressing puck having upper and lower surfaces, said lower surface of said pressing puck being seated on said top surface of said rigid plate, said upper surface of said pressing puck being directly opposite said pressing surface; and
   a drive for uniformly applying force to said bottom surface of said rigid plate to drive said rigid plate and said pressing puck toward said pressing surface.

16. The apparatus of claim 15, wherein said press plate comprises a highly polished pressing surface.

17. The apparatus of claim 15, further comprising:
   a lift for lifting said wafer off said upper surface of said pressing puck.

18. The apparatus of claim 15, wherein said pressing puck is formed from a material that will sufficiently deform upon application of said force applied to said rigid plate.

19. The apparatus of claim 18, wherein said pressing puck is formed from a material selected from the group consisting of silicone, silicone-based rubbers and combinations thereof.

20. An apparatus for globally planarizing a surface, comprising:
   a press plate having a pressing surface;
   a rigid plate having a top surface opposing said pressing surface; and a puck member positioned on said top surface of said rigid plate opposing said pressing surface to apply a force applied to said puck member using said press plate and said rigid plate.

21. The apparatus of claim 20, wherein the force applied to said puck member is applied to said rigid plate to press said puck member against said press plate.

22. The apparatus of claim 20, wherein said puck member is deformable under the force applied thereto.

23. The apparatus of claim 20, wherein said puck member comprises silicone rubber.

24. The apparatus of claim 20, wherein said puck member deforms under the force applied thereto.

25. The apparatus of claim 20, wherein:
said rigid plate is substantially parallel to said pressing surface; and
said puck member has substantially parallel upper and lower surfaces, said lower surface of said puck member being seated on said top surface of said rigid plate, said upper surface of said puck member being directly opposite and substantially parallel to said pressing surface.

26. An apparatus for performing global planarization of a deformable surface of a wafer comprising:
a chamber body having an interior surface and first and second ends;
a base plate attached to and closing said first end of said chamber body, said base plate having an inner surface;
a press plate attached to and closing said second end of said chamber body, said press plate having a pressing surface, said pressing surface, said inner surface and said interior surface defining a chamber;
a rigid plate having a top surface and a bottom surface disposed within said chamber, said top surface being substantially parallel to said pressing surface;
a force distribution puck having upper and lower surfaces, said lower surface of said force distribution puck being seated on said top surface of said rigid plate, said upper surface of said force distribution puck being directly opposite and substantially parallel to said pressing surface; and
a drive for applying a force to said bottom surface of said rigid plate to drive said rigid plate and said force distribution puck toward said pressing surface.

27. The apparatus of claim 26, wherein said press plate comprises a highly polished pressing surface.

28. The apparatus of claim 26, further comprising:
a lift for lifting said wafer off said upper surface of said force distribution puck.

29. The apparatus of claim 26, wherein said force distribution puck is formed from a material that will sufficiently deform upon applying a force thereto.

30. The apparatus of claim 26, wherein said force distribution puck is formed from a material selected from the group consisting of silicone, silicone based rubbers and combinations thereof.

31. A method for globally planarizing a surface of a semiconductor wafer comprising:
providing a pressing surface;
placing said wafer on one side of a pressing puck; and
applying a force to a rigid plate adjacent to another side of said pressing puck to cause said surface of said wafer to correspond to said pressing surface.

32. The method of claim 31, further comprising:
curing said surface of said wafer to maintain a shape corresponding to said pressing surface.

33. The method of claim 31, further comprising:
providing said wafer, pressing puck, rigid plate and pressing surface in an apparatus.

34. The method of claim 31, further comprising:
controlling the temperature of the wafer while applying said force to said wafer.

35. A method for globally planarizing a surface of a wafer comprising:
providing a pressing puck seated on a rigid plate, and a planar pressing surface directly opposable to the pressing puck, the pressing puck being deformable under a force to distribute the force between the rigid plate and the pressing surface;
placing a wafer having a surface to be planarized on the pressing puck; and
applying a force using the rigid plate and the planar pressing surface to deform the pressing puck which applies the force to the surface of the wafer to cause the surface to correspond to the planar pressing surface.

36. The method of claim 35, further comprising:
the step of curing the surface of said wafer to maintain a shape corresponding to the pressing surface.

37. The method of claim 35, wherein:
said step of providing a pressing surface further comprises providing a pressing surface having a highly polished surface; and
said step of placing further comprises placing a wafer having an ultraviolet radiation curable surface on the pressing puck.

38. The method of claim 35, wherein said step of applying further comprises applying a force to the rigid plate to drive the surface of the wafer against the pressing surface.

39. The method of claim 35, wherein said step of providing a pressing puck further comprises providing a pressing puck comprised of a silicone rubber.

40. The method of claim 35, wherein said step of providing a pressing puck further comprises providing a pressing puck comprising a silicone rubber puck.

41. The method of claim 35, further comprising the steps of:
releasing the applied force to retract the surface of the wafer from the pressing surface;
lifting the wafer off the pressing puck; and
removing the wafer from the pressing puck.

42. The method of claim 35, further comprising:
controlling the temperature of the wafer.

43. A method for globally planarizing a surface of a wafer comprising:
providing a resilient puck seated on a rigid plate, and a planar pressing surface directly opposable to the resilient puck, the resilient puck being sufficiently deformable under an applied force to apply the force between the rigid plate and the pressing surface;
placing a wafer having a surface to be planarized on the resilient puck; and
applying a force using the rigid plate and the planar pressing surface to deform the resilient puck which applies the force to the surface of the wafer to cause the surface to correspond to the planar pressing surface.

44. The method of claim 43, further comprising:
the step of curing the surface of said wafer to maintain a shape corresponding to the pressing surface.

45. The method of claim 43, wherein:
said step of providing a pressing surface further comprises providing a pressing surface having a highly polished surface; and said step of placing further comprises placing a wafer having an ultraviolet radiation curable surface on the resilient puck.

46. The method of claim 43, wherein said step of applying further comprises applying a force to the rigid plate to drive the surface of the wafer against the pressing surface.

47. The method of claim 43, wherein said step of providing a resilient puck further comprises providing a resilient puck comprised of a silicone rubber.

48. The method of claim 43, wherein said step of providing a resilient puck further comprises providing a resilient puck comprising a silicone rubber puck.

49. The method of claim 43, further comprising the steps of:

releasing the applied force to retract the surface of the wafer from the pressing surface;

lifting the wafer off the resilient puck; and removing the wafer from the resilient puck.

50. The method of claim 43, further comprising:

controlling the temperature of the wafer.

51. A method for globally planarizing a surface of a semiconductor wafer comprising:

providing a pressing surface;

placing said wafer on one side of a flexible puck; and applying a force to a rigid plate adjacent to another side of said flexible puck to cause said surface of said wafer to correspond to said pressing surface.

52. The method of claim 51, further comprising:

curing said surface of said wafer to maintain a shape corresponding to said pressing surface.

53. The method of claim 51, further comprising:

providing said wafer, flexible puck, rigid plate and pressing surface in an apparatus.

54. The method of claim 51, further comprising:

controlling the temperature of the wafer while applying said force to said wafer.

* * * * *

UNITED STATES PATENT AND TRADEMARK OFFICE
CERTIFICATE OF CORRECTION

PATENT NO. : 6,062,133
DATED : May 16, 2000
INVENTOR(S) : Guy Blalock

It is certified that error appears in the above-identified patent and that said Letters Patent is hereby corrected as shown below:

<u>Column 1,</u>
Line 8, change "N.o." to -- No. --

<u>Column 4,</u>
Line 19, before "all" delete "the"

Signed and Sealed this

Sixteenth Day of September, 2003

JAMES E. ROGAN
*Director of the United States Patent and Trademark Office*